(12) United States Patent
Bazemore et al.

(10) Patent No.: US 12,012,353 B2
(45) Date of Patent: Jun. 18, 2024

(54) METHOD FOR CONTROLLING SURFACE FEATURES ON GLASS-CERAMIC ARTICLES AND ARTICLES FORMED THEREFROM

(71) Applicant: CORNING INCORPORATED, Corning, NY (US)

(72) Inventors: Brandon Allen Bazemore, Concord, NC (US); Jun Hou, Painted Post, NY (US); Yuhui Jin, Painted Post, NY (US); Eungsik Park, Yorba Linda, CA (US); Tammy Lynn Petriwsky, Elmira, NY (US)

(73) Assignee: Corning Incorporated, Corning, NY (US)

( * ) Notice: Subject to any disclaimer, the term of this patent is extended or adjusted under 35 U.S.C. 154(b) by 309 days.

(21) Appl. No.: 16/363,257

(22) Filed: Mar. 25, 2019

(65) Prior Publication Data

US 2019/0218138 A1   Jul. 18, 2019

Related U.S. Application Data

(62) Division of application No. 15/051,003, filed on Feb. 23, 2016, now Pat. No. 10,239,782.

(Continued)

(51) Int. Cl.
*C03C 15/00* (2006.01)
*C03C 10/00* (2006.01)
*H05K 5/00* (2006.01)

(52) U.S. Cl.
CPC .............. *C03C 15/00* (2013.01); *C03C 10/00* (2013.01); *H05K 5/00* (2013.01); *Y10T 428/24355* (2015.01)

(58) Field of Classification Search
CPC .......... C03C 15/00; C03C 10/00; H05K 5/00; Y10T 428/24355; B32B 3/30; B32B 3/26; B32B 3/00
See application file for complete search history.

(56) References Cited

U.S. PATENT DOCUMENTS 3,616,098 A   10/1971   Falls
4,882,214 A   11/1989   Hecq
(Continued)

FOREIGN PATENT DOCUMENTS

CN   102448904 A   5/2012
CN   102712517 A   10/2012
(Continued)

OTHER PUBLICATIONS https://www.macmillandictionary.com/us/dictionary/american/translucent, accessed Nov. 1, 2022 (Year: 2022).*

(Continued)

*Primary Examiner* — Nancy R Johnson
(74) *Attorney, Agent, or Firm* — William J. Tucker

(57) ABSTRACT

A method for increasing the tactile feel of a glass-ceramic article includes (a) performing a first etching of a surface of the glass-ceramic article with a first etchant to create a plurality of features on the surface, wherein the first etchant comprises hydrofluoric acid and an inorganic fluoride salt, and the plurality of features comprises protrusions and recesses and (b) performing a second etching of the surface with a second etchant different from the first etchant to enlarge a distance between adjacent features of a same type, wherein the second etching occurs after the first etching, after the second etching an average distance between adjacent features of a same type is in a range from 0.5 µm to 20 µm and a density of features of the same type is in a range from 9,000 to 25,000 features/mm², and a tactile feel of the (Continued)

surface after the second etching is greater than the tactile feel of the surface before the first etching.

18 Claims, 3 Drawing Sheets

Related U.S. Application Data

(60) Provisional application No. 62/121,012, filed on Feb. 26, 2015.

(56) References Cited

U.S. PATENT DOCUMENTS

| | | | |
|---|---|---|---|
| 5,491,115 | A | 2/1996 | Pfitzenmaier et al. |
| 6,936,555 | B2 | 8/2005 | Pinckney |
| 7,465,687 | B2 | 12/2008 | Beall |
| 2007/0231542 | A1* | 10/2007 | Deng .................. B08B 17/065 |
| | | | 428/141 |
| 2007/0281850 | A1* | 12/2007 | Beall .................. C03C 10/0045 |
| | | | 501/10 |
| 2010/0209673 | A1* | 8/2010 | Viasnoff .................. B44C 1/227 |
| | | | 428/172 |
| 2010/0246016 | A1 | 9/2010 | Carlson et al. |
| 2011/0062849 | A1 | 3/2011 | Carlson et al. |
| 2011/0092353 | A1* | 4/2011 | Amin .................... C03C 10/16 |
| | | | 501/3 |
| 2012/0135848 | A1 | 5/2012 | Beall et al. |
| 2013/0040116 | A1 | 2/2013 | Henze et al. |
| 2013/0040166 | A1 | 2/2013 | Box et al. |
| 2013/0107370 | A1* | 5/2013 | Lander ................. C09D 133/12 |
| | | | 359/609 |
| 2013/0136909 | A1 | 5/2013 | Mauro et al. |
| 2014/0087194 | A1 | 3/2014 | Dejneka et al. |
| 2015/0144613 | A1* | 5/2015 | Guillemot ................ H05B 3/74 |
| | | | 219/460.1 |
| 2015/0299034 | A1 | 10/2015 | Hou et al. |
| 2016/0236974 | A1* | 8/2016 | Sinapi ..................... C03C 15/00 |

FOREIGN PATENT DOCUMENTS

| | | |
|---|---|---|
| JP | 63-021241 A | 1/1988 |
| JP | 2012-521958 A | 9/2012 |
| JP | 2013-504514 A | 2/2013 |
| TW | 201431810 A | 8/2014 |
| WO | 2012075068 A2 | 6/2012 |
| WO | 2014070869 A1 | 5/2014 |

OTHER PUBLICATIONS https://www.merriam-webster.com/dictionary/translucent, accessed Nov. 1, 2022 (Year: 2022).*
International Search Report and Written Opinion PCT/US2016/019211 Dated Jun. 7, 2016.
Japanese Patent Application No. 2017544928; Machine Translation of the Office Action Mailed Dec. 4, 2019; Japan Patent Office; 3 Pgs.

* cited by examiner

METHOD FOR CONTROLLING SURFACE FEATURES ON GLASS-CERAMIC ARTICLES AND ARTICLES FORMED THEREFROM

CROSS-REFERENCE TO RELATED APPLICATIONS

This application is a divisional of and claims priority under 35 U.S.C. § 121 of U.S. application Ser. No. 15/051,003, filed on Feb. 23, 2016, now U.S. Pat. No. 10,239,782, which claims the benefit of priority under 35 U.S.C. § 119 of U.S. Provisional Application Ser. No. 62/121,012, filed on Feb. 26, 2015, the content of each of which are relied upon and incorporated herein by reference in their entirety.

BACKGROUND

Field

The present disclosure relates to methods of modifying a glass-ceramic article, and more particularly, relates to methods of modifying the surface of a glass-ceramic article to increase the tactile feel of the surface.

Technical Background

The use of glass ceramics in electronic devices is becoming increasingly popular. The use of glass and glass ceramics in electronic devices provides optical properties and surface textures which significantly influence the functionality, tactile feeling, and appearance of such devices. In particular, the tactile feel (the perception of texture by touch) of glass and glass ceramics has become important in recent years to meet consumer demands.

Tactile feel is the faculty by which external objects or forces are perceived through contact with the body (especially the hands and fingers). Factors for evaluating tactile feel can be determined based on both the object (for example the surface texture) and the person who evaluates the object. Thus tactile feel can vary from material to material and from person to person. There is a need to establish a correlation between tactile feel and surface texture of the object, as well as methods for modifying the surface texture of an object to increase its tactile feel.

SUMMARY

Disclosed herein is a method for increasing the tactile feel of a glass-ceramic article includes (a) performing a first etching of a surface of the glass-ceramic article with a first etchant to create a plurality of features on the surface, wherein the first etchant comprises hydrofluoric acid and an inorganic fluoride salt, and the plurality of features comprises protrusions and recesses and (b) performing a second etching of the surface with a second etchant different from the first etchant to polish the plurality of features and enlarge a distance between adjacent features of a same type, wherein the second etching occurs after the first etching, after the second etching an average distance between adjacent features of a same type is in a range from 0.5 μm to 25 μm and a density of features of the same type is in a range from 9,000 to 25,000 features/mm$^2$, and a tactile feel of the surface after the second etching is greater than the tactile feel of the surface before the first etching. In some embodiments, the first etchant can also include a wetting agent.

Also disclosed herein is a glass-ceramic article having a surface with a plurality of features, wherein the plurality of features comprises protrusion and recesses in the surface and an average distance between features of a same type is in a range from 0.5 μm to 25 μm and a density of features of the same type is in a range from 9,000 to 25,000 features/mm$^2$.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiment(s), and together with the description serve to explain principles and operation of the various embodiments.

DETAILED DESCRIPTION

Embodiments of the present disclosure relate to methods for increasing the tactile feel of a glass-ceramic article. In some embodiments, increasing the tactile feel can be accomplished by roughening a surface of the glass-ceramic article with a series of etching procedures. For example, the method can include performing a first etching of a surface of a glass-ceramic article with a first etchant to create features on the surface and subsequently performing a second etching of the surface with a second etchant different from the first etchant to polish the surface features and/or increase a distance between adjacent features. FIG. 1A-1D illustrates an exemplary cross-sectional view of a glass-ceramic article at each stage during an exemplary process for modifying the surface of the glass-ceramic article to increase the tactile feel.

Figure 1A:
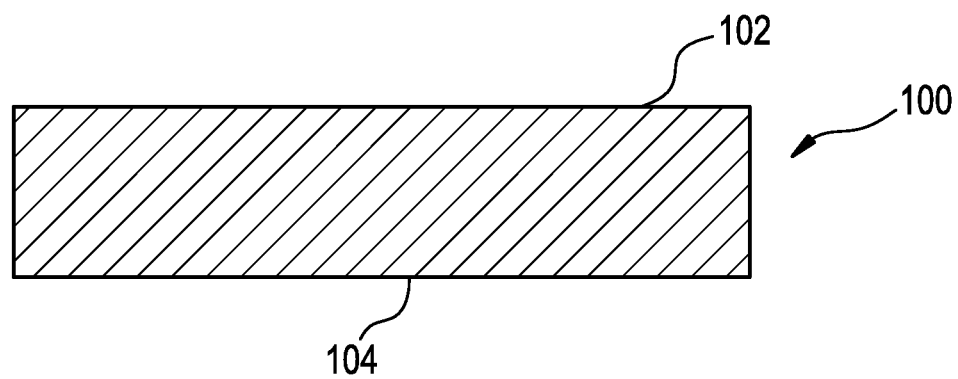
FIG. 1A-1D is an exemplary cross-sectional view of a glass-ceramic article at each stage during an exemplary process for modifying the surface of the glass-ceramic article to increase the tactile feel.

FIG. 1A illustrates a glass-ceramic article 100 having opposing first and second surfaces 102 and 104. As set forth in U.S. Pat. No. 5,491,115, the contents of which are hereby incorporated by reference in their entirety, a glass-ceramic is a material having at least one crystalline phase thermally developed in a substantially uniform pattern throughout at least a portion of a glass precursor. In addition to having at least one crystalline phase, glass-ceramics also have an amorphous phase. Glass-ceramics find application in a variety of areas, including the fabrication of articles employed in the preparation and serving of food and also in electronic devices. Glass-ceramic materials are generally produced by: 1) melting a mixture of raw materials, generally including a nucleating agent, to produce a glass; 2) forming an article from the glass and cooling the glass below its transformation range; and 3) crystallizing (i.e., "ceramming") the glass article by an appropriate treatment. Glass-ceramics provide an array of materials possessing a variety of properties such as zero porosity, high strength, translucency, toughness, opacity, pigmentation, and opalescence. Such properties may be provided by choice of base glass composition and control of the heat treatment and crystallization of the base glass. Examples of suitable glass-ceramic articles include those formed from the following glass-ceramic systems: 1) $Li_2O$—$Al_2O_3$—$SiO_2$ System (i.e., LAS-System); 2) MgO—$Al_2O_3$—$SiO_2$ System (i.e., MAS-System); and 3) ZnO—$Al_2O_3$—$SiO_2$ System (i.e., ZAS-System).

Examples of suitable transparent, translucent, or opaque glass-ceramic articles include LAS-System glass-ceramic articles, i.e. lithium alumino silicate glass-ceramic articles. As set forth in U.S. Pat. No. 5,491,115, the LAS-System may generally provide highly crystallized glass-ceramics which include a predominant crystalline phase of: 1) a transparent beta-quartz solid solution; or 2) an opaque beta-spodumene solution (dependent upon the ceramming temperature). The appearance of such LAS-System glass-ceramics may be varied by varying ceramming conditions, e.g., heat treatment. Accordingly, transparent, translucent, or opaque glass-ceramics (which may be water-white, translucent, opaque, white, or variously colored) may be achieved. More particularly, as set forth in U.S. Pat. No. 5,491,115, transparent glass-ceramics in the LAS-System may be achieved by ceramming precursor glass at a relatively low temperature which does not normally exceed about 900° C. Moreover, ceramming the same glass at a higher temperature of about 1150° C. may produce an opaque beta-spodumene crystalline phase. At such a high temperature, small beta-quartz crystals may convert to beta-spodumene crystals and grow in size, thereby rendering the product opaque.

Additional examples of suitable translucent or opaque lithium alumino silicate glass-ceramic articles are set forth in International Publication No. WO 2012/075068, the contents of which are hereby incorporated by reference in their entirety. As set forth in International Publication No. WO 2012/075068, the translucent or opaque silicate crystal-containing glass-ceramics include, in weight percent on an oxide basis, 40-80% $SiO_2$, 2-30% $Al_2O_3$, 2-30% $Al_2O_3$, 2-10% $Li_2O$, 0-8% $TiO_2$, 0-3% ZrO, 0-2% $SnO_2$, 0-7% $BrO_3$, 0-4% MgO, 0-12% ZnO, 0-8% BaO, 0-3% CaO, 0-6% SrO, 0-4% $K_2O$, up to 2% $Na_2O$, 0-1.0% $Sb_2O_3$, 0-0.25% Ag, 0-0.25% $CeC_2$, the combination of $Li_2$+$Na_2O$/$Al_2O_3$+$B_2O_3$ in amount of greater than 0.8 mol %, and the combination of $TiO_2$+$ZrO_2$+$SnO_2$ in an amount of at least 3.0 mol %. Such silicate crystal-containing glass-ceramics may be generally formed by: a) melting a batch for, and down drawing a glass article having a composition including, in weight percent on an oxide basis, of 40-80% $SiO_2$, 2-30% $Al_2O_3$, 5-30% $Na_2O$, 0-8% $TiO_2$, 0-12% ZrO, 0-2% $SnO_2$, 0-7% $B_2O_3$, 0-4% MgO, 0-6% ZnO, 0-8% BaO, 0-3% CaO, 0-6% SrO, 0-4% $K_2O$, 0-2% $Li_2O$, 0-1.0% $Sb_2O_3$, 0-0.25% Ag, 0-0.25% $CeO_2$, the combination of $Na_2O$/$Al_2O_3$+$B_2O_3$ in an amount of greater than 0.8 mol %, and the combination of $TiO_2$+$ZrO_2$+$SnO_2$ in an amount of at least 3.0 mol %; b) ion exchanging the glass article by placing the glass article in a Li-containing salt bath exhibiting a temperature sufficiently above the glass strain point and holding the glass sheet for time sufficient to complete ion exchange of Li for Na ions substantially throughout the glass article; c) ceramming the glass to a temperature between about 550-1100° C. for a period of time sufficient to cause the generation of a glass-ceramic which contains a predominant silicate crystalline phase of lithium alumino silicate (beta-spodumene and/or beta-quartz solid solution), lithium metasilicate and/or lithium disilicate phase and exhibits a glass-ceramic composition within the $SiO_2$—$R_2O_3$—$Li_2O$/$Na_2O$—$TiO_2$ system, and; d) cooling the glass-ceramic article to room temperature.

Also set forth in International Publication No. WO 2012/075068, an opaque glass-ceramic article glass-ceramic article having a predominant spodumene crystalline phase and a minor rutile crystalline phase is disclosed. Such opaque glass-ceramic articles may be formed from a precursor glass from the basic $SiO_2$—$Al_2O_3$—$Na_2O$ system. More particularly, a simple sodium alumino silicate glass with the following batched composition, in weight percent, may be produced: 58.8% $SiO_2$, 21.5% $Al_2O_3$, 13.6% $Na_2O$, 0.3% $SnO_2$, and 4.3% $TiO_2$. This glass may be batched, mixed, and melted in a platinum crucible at 1650° C. and thereafter annealed at 650° C. This glass may then be cut, polished, and placed in a molten salt bath of a composition having 75 wt. % $Li_2SO_4$ and 25 wt. % $Na_2SO_4$ and held for two hours at a temperature of 800° C. This time and temperature may be sufficient to allow $Li^+$ and $Na^+$ ion exchange and to allow internal nucleation and crystallization to occur over the whole thickness of the glass, i.e., ion-exchange and ceramming may occur simultaneously in the molten salt bath. The resultant glass-ceramic article may be a white glass-ceramic exhibiting a glossy skin. Additionally, such white glass-ceramic articles may include lithium aluminosilicate as the predominant crystalline phase. More particularly, such white glass-ceramic articles may include beta-spodumene as the predominant crystalline phase, rutile as the minor crystalline phase, and amorphous phases.

Additionally, as set forth in U.S. Publication No. 2013/0136909, Corning® Gorilla® Glass (Corning Incorporated, Corning, NY), is an example of an alkali aluminosilicate glass. Such publication also discloses a method of making colored glass articles from aluminosilicate glass articles. The contents of U.S. Publication No. 2013/0136909 are hereby incorporated by reference in their entirety.

Additional examples of suitable glass-ceramic articles include MAS-System glass-ceramic articles, i.e., magnesium aluminum silicate glass-ceramic articles. As set forth in U.S. Pat. No. 7,465,687, the contents of which are hereby incorporated by reference in their entirety, the MAS-System may generally provide glass-ceramic articles having a predominant crystalline phase of cordierite. Such glass-ceramic articles may also include minor crystalline phases of: 1) an acicular crystalline phase such as titanates, including e.g., magnesium titanates, aluminum titanates and combinations thereof; and/or 2) ceramic compounds capable of lamellar twinning, including e.g., enstatite, and/or anorthite. In one or more embodiments, such glass-ceramic articles may include from 50-80 volume % cordierite, from 8-20 volume % of an acicular minor phase, and up to 20 volume % of ceramic compounds capable of lamellar twinning. In additional embodiments, the glass-ceramic article may be formed from a composition having, in weight %, 35-50% SiO2, 10-35% $Al_2O_3$, 10-25% MgO, 7-20% TiO2, up to 5% CaO, and up to 10% SrO, and up to 5% F, where CaO+SrO is at least 0.5%.

Further examples of suitable glass-ceramic articles include ZAS-System glass-ceramic articles, i.e., zinc oxide alumino silicate glass-ceramic articles. As set forth in U.S. Pat. No. 6,936,555, the contents of which are hereby incorporated by reference in their entirety, the ZAS-System may generally provide transparent glass-ceramic articles exhibiting a predominant crystalline phase of hexagonal ZnO crystals. In one or more embodiments, such glass-ceramic articles may include at least 15%, by weight, of hexagonal ZnO crystals. In additional embodiments, such glass-ceramic articles may include a total crystallinity ranging from 15-35% of ZnO crystals. In another embodiment, the glass-ceramic article may be formed from a composition including, in weight percent, 25-50% $SiO_2$, 0-26% $Al_2O_3$, 15-45% ZnO, 0-25% $K_2O$, 0-10% $Na_2O$, 0-32% $Ga_2O_3$, $K_2O + Na_2O > 10\%$, and $Al_2O_3 + Ga_2O_3 > 10\%$.

In some embodiments, the glass-ceramic article is transparent, translucent, or opaque. In one particular embodiment, the glass-ceramic article is black. In another particular embodiment, the glass-ceramic article is white. In other embodiments, the glass-ceramic article is a lithium alumino silicate glass-ceramic article, a magnesium aluminum silicate glass-ceramic article, or a zinc oxide alumino silicate glass-ceramic article. In some embodiments, the glass-ceramic is color-tuned, as set forth in US. Pub. No. 2014/0087194, the contents of which are hereby incorporated by reference in their entirety.

In some embodiments, the glass-ceramic article has a major crystalline phase. As used herein, the term "major crystalline phase" refers to a glass-ceramic having greater than or equal to 30% by volume crystallinity. In one particular embodiment, the glass-ceramic article has about 90% by volume crystallinity. Alternatively, in other embodiments, the glass-ceramic article has a major amorphous phase. As used herein, the terms "major amorphous phase" or "major glass phase" are used interchangeably to refer to a glass-ceramic having less than 30% by volume crystallinity. In one particular embodiment, the glass-ceramic article has about 95% by volume amorphous phase.

Figure 1B:
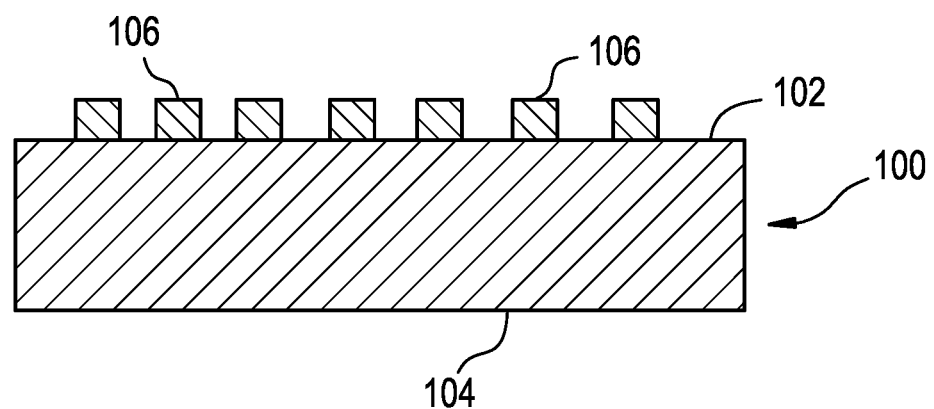

As illustrated in FIG. 1B, a mask 106 can be formed on first surface 102 of glass-ceramic article 100 to selectively etch surface features into first surface 102 to increase the tactile feel of glass-ceramic article 100. Application of a first chemical etching solution to a surface of the glass-ceramic article can result in the generation of an in situ mask, wherein crystals are formed on the surface. In some embodiments, the first chemical etching solution can be formed by mixing hydrofluoric acid (i.e., HF) and an inorganic fluoride salt (i.e., an inorganic cation, $X^+$ and $F^-$). Dissolution of the glass-ceramic article results in the formation of the anions $SiF_6^{2-}$ and $AlF_6^{3-}$, formed between fluoride ions from the first chemical etching solution and elements dissolved thereby from the glass-ceramic material. Such anions may then combine with cations from the first chemical etching solution, i.e., inorganic cations $X^+$ of the inorganic fluoride salt. The combination of such inorganic cations $X^+$ with the formed anions $SiF_6^{2-}$ and $AlF_6^{3-}$ results in the formation of crystals on the non-damaged surface of the glass-ceramic article. Without being bound by the theory, it is believed that the formation and/or growth of such crystals on the non-damaged surface shield a portion of the non-damaged surface while the surround surface remains exposed to the chemical etching solution. Stated another way, it is believed that the formation and/or growth of such crystals on the non-damaged surface of the glass-ceramic article prevents the glass-ceramic article underneath of such crystals from being etched and/or modified. Accordingly, differential etching can be achieved and result in a roughened and/or textured surface upon removal of such crystals. In some embodiments, wax particles may be added to the chemical etching solution to assist in formation of the in situ mask. The in situ mask or crystals 106 can be formed upon dissolution of a portion of the glass-ceramic article by the first chemical etching solution.

With regard to hydrofluoric acid, the chemical etching solution can include from about 0.5% (w/w) to about 6% (w/w), about 0.5% (w/w) to about 5% (w/w), about 0.5% (w/w) to about 4% (w/w), about 0.5% (w/w) to about 3% (w/w), about 1% (w/w) to about 6% (w/w), about 1% (w/w) to about 5% (w/w), about 1% (w/w) to about 4% (w/w), about 1% (w/w) to about 3% (w/w), about 2% (w/w) to about 6% (w/w), about 2% (w/w) to about 5% (w/w), about 2% (w/w) to about 4% (w/w), about 2% (w/w) to about 3% (w/w), about 3% (w/w) to about 6% (w/w), about 3% (w/w) to about 5% (w/w), about 3% (w/w) to about 4% (w/w), or about 4% (w/w) to about 6% (w/w) hydrofluoric acid. With regard to inorganic fluoride salts, the chemical etching solution can include from about 2.5% (w/w) to about 30% (w/w), about 2.5% (w/w) to about 25% (w/w), about 2.5% (w/w) to about 20% (w/w), about 2.5% (w/w) to about 15% (w/w), about 2.5% (w/w) to about 10% (w/w), about 2.5% (w/w) to about 5% (w/w), about 5% (w/w) to about 30% (w/w), about 5% (w/w) to about 25% (w/w), about 5% (w/w) to about 20% (w/w), about 5% (w/w) to about 15% (w/w), about 5% (w/w) to about 10% (w/w), about 10% (w/w) to about 30% (w/w), about 10% (w/w) to about 25% (w/w), about 10% (w/w) to about 20% (w/w), about 10% (w/w) to about 15% (w/w), about 15% (w/w) to about 30% (w/w), about 15% (w/w) to about 25% (w/w), about 15% (w/w) to about 20% (w/w), about 20% (w/w) to about 30% (w/w), about 20% (w/w) to about 25% (w/w), or about 25% (w/w) to about 30% (w/w) inorganic fluoride salt. Examples of suitable inorganic fluoride salts include, but are not limited to, ammonium fluoride (i.e., $NH_4F$), ammonium bifluoride (i.e., $NH_4F \cdot HF$ and hereinafter "ABF"), buffered hydrofluoric acid (hereinafter "BHF"), sodium fluoride (i.e., NaF), sodium bifluoride (i.e., $NaHF_2$), potassium fluoride (i.e., KF), potassium bifluoride (i.e., $KHF_2$), and combinations thereof. However, additional inorganic fluoride salts known to those of skill in the art are also contemplated for use as described herein although not explicitly described.

In some embodiments, the first chemical etching solution can also include a wetting agent. In such embodiments, the first chemical etching solution can include from about 5% (w/w) to about 40% (w/w), about 5% (w/w) to about 35% (w/w), about 5% (w/w) to about 30% (w/w), about 5% (w/w) to about 25% (w/w), about 5% (w/w) to about 20% (w/w), about 5% (w/w) to about 15% (w/w), about 5% (w/w) to about 10% (w/w), about 10% (w/w) to about 40% (w/w), about 10% (w/w) to about 35% (w/w), about 10% (w/w) to about 30% (w/w), about 10% (w/w) to about 25% (w/w), about 10% (w/w) to about 20% (w/w), about 10% (w/w) to about 15% (w/w), about 15% (w/w) to about 40% (w/w), about 15% (w/w) to about 35% (w/w), about 15% (w/w) to about 30% (w/w), about 15% (w/w) to about 25% (w/w), about 15% (w/w) to about 20% (w/w), about 20% (w/w) to about 40% (w/w), about 20% (w/w) to about 35% (w/w), about 20% (w/w) to about 30% (w/w), about 20% (w/w) to about 25% (w/w), about 25% (w/w) to about 40% (w/w), about 25% (w/w) to about 35% (w/w), about 25% (w/w) to about 30% (w/w), about 30% (w/w) to about 40% (w/w), about 30% (w/w) to about 35% (w/w), or about 35% (w/w) to about 40% (w/w) wetting agent. In some embodiments, the first chemical etching solution can include up to about 5% (w/w), about 10% (w/w), about 15% (w/w), about 20% (w/w), about 25% (w/w), about 30% (w/w), about 35% (w/w), or about 40% (w/w) wetting agent. Examples of suitable wetting agents for use with the chemical etching solutions described herein include glycols (e.g., propylene glycol), glycerols (e.g., glycerol), alcohols (e.g., isopropyl alcohol), surfactants, acids (e.g., acetic acid), and combinations thereof. However, additional wetting agents known to those of skill in the art are also contemplated for use as described herein although not explicitly described.

In some embodiments, the first chemical etching solution can also include a mineral acid. The addition of a mineral acid to the first chemical etching solution may accelerate the etching rate. Examples of suitable mineral acids for use with the chemical etching solutions described herein include hydrochloric acid, nitric acid, phosphoric acid, sulfuric acid, boric acid, hydrofluoric acid, hydrobromic acid, perchloric acid, and combinations thereof.

In some embodiments, the first chemical etching solution is applied to a surface of the glass-ceramic article. In some embodiments, the first chemical etching solution can be a cream, a slurry, or a solution. Suitable examples of methods for applying the chemical etching solution to the surface of the glass-ceramic article include spraying, curtain-coating, screen-printing, dip-coating, spin-coating, applying with a roller, rod-coating, roll-coating, and similar methods, and combinations thereof. In some embodiments, the chemical etching solution is applied to the surface of the glass-ceramic article by dip-coating, i.e., immersing, the glass-ceramic article in the chemical etching solution.

Figure 1C:
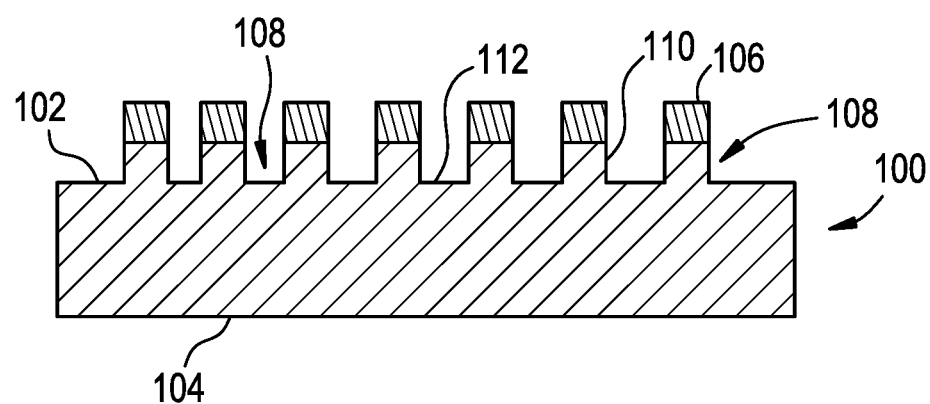

Next, as illustrated in FIG. 1C, features 108 can be formed by differential etching and/or differential modification of first surface 102. In some embodiments, first chemical etching solution can also be used to perform the differential etching. In some embodiments, the differential etching and crystal formation can occur simultaneously. The uniqueness of glass-ceramics in having both a crystalline phase and an amorphous phase allows for differential etching and/or differential modification of the respective phases with chemical etchants, e.g., chemical etching solutions. Differential etching refers to the ability of the crystalline phase and the amorphous phase of glass-ceramic articles to be etched and/or modified at different rates by the same chemical etchants and/or chemical etching solutions. With regard to chemical etching solutions suitable for both glass-ceramic articles having a major crystalline phase and glass-ceramic articles having a major amorphous phase, in some embodiments, the chemical etching solution can be the first chemical etching solution discussed above, which is formed by mixing hydrofluoric acid (i.e., HF), an inorganic fluoride salt (i.e., an inorganic cation, $X^+$ and $F^-$), and optionally a wetting agent. Thus, in some embodiments, the chemical etching solution used for differential etching to create features 108 can be the same chemical etching solution used to create mask 106.

In some embodiments, the first chemical etching solution can be applied to glass-ceramic article 100 for a time sufficient to create features 108. The first chemical etching solution can be applied to first surface 102 of glass-ceramic article 100 for an etching time of about 5 s to less than 15 min. Alternatively, the first chemical etching solution can be applied to first surface 102 of the glass-ceramic article for an etching time of about 15 s to about 8 min, 1 min to about 8 min, or from about 1 min to about 4 min, or from about 4 min to about 8 min, or from about 2 min to about 8 min, or from about 2 min to about 6 min, or from about 1 min to about 4 min. In one embodiment, the first chemical etching solution can be applied to the surface of the glass-ceramic article for an etching time of less than about 10 min. In another embodiment, the chemical etching solution can be applied to the surface of the glass-ceramic article for an etching time of less than 5 min.

In some embodiments, features 108 correspond to a pattern of mask 106 such that areas of first surface 102 of glass-ceramic article 100 covered by mask 106 are protected from etching and areas not covered by mask 106 are etched away. This result in the formation protrusions or peaks 110 (in areas covered by mask 106) and dimples or recesses 112 (in areas not covered by mask 106). Thus, features 108 can include protrusions 110 and recesses 112. The presence of features 108 roughens first surface 102 of glass-ceramic article 100 and increases the texture and tactile feel. Varying the amount of the components of the chemical etching solution affects the distance between similar features 108, for example between adjacent protrusions 110 or adjacent recesses 112. The distance between the similar features in turn affects the tactile feel of first surface 102 of glass-ceramic article 100. For example, increasing the amount of inorganic fluoride salt increases the amount of crystals formed and therefore the density of mask 106. Also, increasing the amount of thickening agent promotes the formation of a denser mask 106. Thus, increasing the amount of inorganic fluoride salt and thickening agent increases the density of mask 106, which in turn decreases the distance between adjacent features 108. Conversely, increasing the amount of hydrofluoric acid decreases the amount of crystal formed, which in turn increases the distance between adjacent features 108.

The first chemical etching solution can modify and/or etch first surface 102 of glass-ceramic article 100 such that from about 0.01 μm to about 20 μm of a depth of glass-ceramic article 100 is removed (i.e., depth of removal) from areas not covered by mask 106. Alternatively, the first chemical etching solution can modify and/or etch first surface 102 of glass-ceramic article 100 such that from about 0.01 μm to about 2 μm, or from about 0.1 μm to about 2 μm, or from about 0.25 μm to about 1 μm, or from about 0.25 μm to about 0.75 μm, or from about 0.5 μm to about 0.75 μm of the depth of glass-ceramic article 100 is removed from areas not covered by mask 106.

In some embodiments, the composition of the first etching solution and the etching parameters can be adjusted to control the surface roughness (Ra) of first surface 102. In some embodiments, the surface roughness (Ra) of first surface 102 can be controlled to be from about 0.08 μm to about 1 μm. The surface roughness (Ra) was determined with a Newview™ 7300 (Zygo Corporation, Middlefield, CT).

In some embodiments, at the conclusion of the differential etching, mask 106 and first chemical etching solution can be removed from first surface 102. The mask 106 and first chemical etching solution can be removed by rinsing first surface 102 of glass-ceramic article 100 with deionized water or an acid solution diluted with deionized water.

Figure 1D:
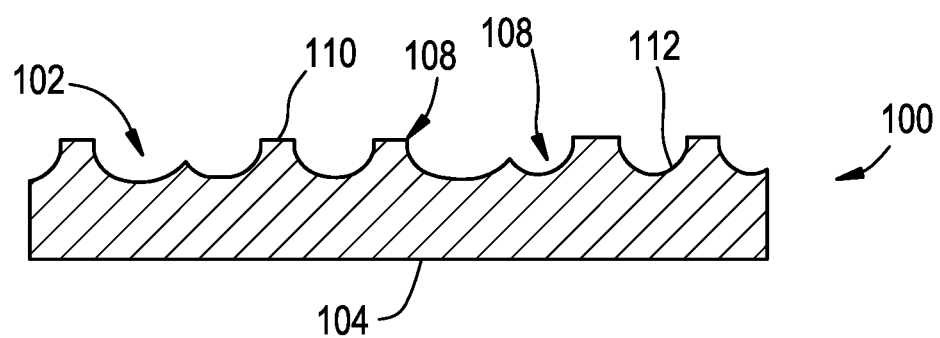

Next as shown in FIG. 1D, first surface 102 of glass-ceramic article 100 can be polished with a second chemical etching solution to enlarge the distance between like features (e.g., between adjacent protrusions 110 or between adjacent recesses 112). In some embodiments, the second chemical etching solution can be formed by mixing hydrofluoric acid (i.e., HF), and a mineral acid. With regard to hydrofluoric acid, the second chemical etching solution can have a hydrofluoric acid concentration in a range from about 0.5M to about 6M, about 0.5M to about 5.5M, about 0.5M to about 5M, about 0.5M to about 4.5M, about 0.5M to about 4M, about 0.5M to about 3.5M, about 0.5M to about 3M, about 0.5M to about 2.5M, about 0.5M to about 2M, about 0.5M to about 1.5M, about 0.5M to about 1M, about 1M to about 6M, about 1M to about 5.5M, about 1M to about 5M, about 1M to about 4.5M, about 1M to about 4M, about 1M to about 3.5M, about 1M to about 3M, about 1M to about 2.5M, about 1M to about 2M, about 1M to about 1.5M, about 1.5M to about 6M, about 1.5M to about 5.5M, about 1.5M to about 5M, about 1.5M to about 4.5M, about 1.5M to about 4M, about 1.5M to about 3.5M, about 1.5M to about 3M, about 1.5M to about 2.5M, about 1.5M to about 2M, about 2M to about 6M, about 2M to about 5.5M, about 2M to about 5M, about 2M to about 4.5M, about 2M to about 4M, about 2M to about 3.5M, about 2M to about 3M, about 2M to about 2.5M, about 2.5M to about 6M, about 2.5M to about 5.5M, about 2.5M to about 5M, about 2.5M to about 4.5M, about 2.5M to about 4M, about 2.5M to about 3.5M, about 2.5M to about 3M, about 3M to about 6M, about 3M to about 5.5M, about 3M to about 5M, about 3M to about 4.5M, about 3M to about 4M, about 3M to about 3.5M, about 3.5M to about 6M, about 3.5M to about 5.5M, about 3.5M to about 5M, about 3.5M to about 4.5M, about 3.5M to about 4M, about 4M to about 6M, about 4M to about 5.5M, about 4M to about 5M, about 4M to about 4.5M, about 4.5M to about 6M, about 4.5M to about 5.5M, about 4.5M to about 5M, about 5M to about 6M, about 5M to about 5.5M, or about 5.5M to about 6M. With regard to the mineral acid, the second chemical etching solution can have a mineral acid concentration in a range from about 0.5M to about 6M, about 0.5M to about 5.5M, about 0.5M to about 5M, about 0.5M to about 4.5M, about 0.5M to about 4M, about 0.5M to about 3.5M, about 0.5M to about 3M, about 0.5M to about 2.5M, about 0.5M to about 2M, about 0.5M to about 1.5M, about 0.5M to about 1M, about 1M to about 6M, about 1M to about 5.5M, about 1M to about 5M, about 1M to about 4.5M, about 1M to about 4M, about 1M to about 3.5M, about 1M to about 3M, about 1M to about 2.5M, about 1M to about 2M, about 1M to about 1.5M, about 1.5M to about 6M, about 1.5M to about 5.5M, about 1.5M to about 5M, about 1.5M to about 4.5M, about 1.5M to about 4M, about 1.5M to about 3.5M, about 1.5M to about 3M, about 1.5M to about 2.5M, about 1.5M to about 2M, about 2M to about 6M, about 2M to about 5.5M, about 2M to about 5M, about 2M to about 4.5M, about 2M to about 4M, about 2M to about 3.5M, about 2M to about 3M, about 2M to about 2.5M, about 2.5M to about 6M, about 2.5M to about 5.5M, about 2.5M to about 5M, about 2.5M to about 4.5M, about 2.5M to about 4M, about 2.5M to about 3.5M, about 2.5M to about 3M, about 3M to about 6M, about 3M to about 5.5M, about 3M to about 5M, about 3M to about 4.5M, about 3M to about 4M, about 3M to about 3.5M, about 3.5M to about 6M, about 3.5M to about 5.5M, about 3.5M to about 5M, about 3.5M to about 4.5M, about 3.5M to about 4M, about 4M to about 6M, about 4M to about 5.5M, about 4M to about 5M, about 4M to about 4.5M, about 4.5M to about 6M, about 4.5M to about 5.5M, about 4.5M to about 5M, about 5M to about 6M, about 5M to about 5.5M, or about 5.5M to about 6M. Exemplary mineral acids, include, but are not limited to, hydrochloric acid, nitric acid, phosphoric acid, sulfuric acid, boric acid, hydrobromic acid, perchloric acid, and combinations thereof.

The second chemical etching solution can be applied to polish first surface 102 of glass-ceramic article 100 so as to fine-tune and/or optimize the texture and tactile feel thereof. This is accomplished by increasing the distance between like features (e.g., between adjacent protrusions 110 and between adjacent recesses or dimples 112) as well as polishing or rounding off sharp edges and/or corners of features 108. In some embodiments, the second chemical etching solution can be applied to first surface 102 of glass-ceramic article 100 for an etching time of about 1 min to less than 15 min. Alternatively, the second chemical etching solution can be applied to first surface 102 of the glass-ceramic article 100 for an etching time of about 1 min to about 8 min, or from about 1 min to about 4 min, or from about 4 min to about 8 min, or from about 2 min to about 8 min, or from about 2 min to about 6 min, or from about 1 min to about 4 min.

After polishing with the second chemical etching solution, the tactile feel of first surface 102 is greater than the tactile feel before application of the first chemical etching solution. The tactile feel can be determined by moving a finger across a surface and ranking the tactile feel by how much texture can be felt by the finger. In some embodiments, the ranking of tactile feel can be on a scale from 1 to 7, with 1 having the lowest tactile feel and 7 having the highest tactile feel.

Figure 2:
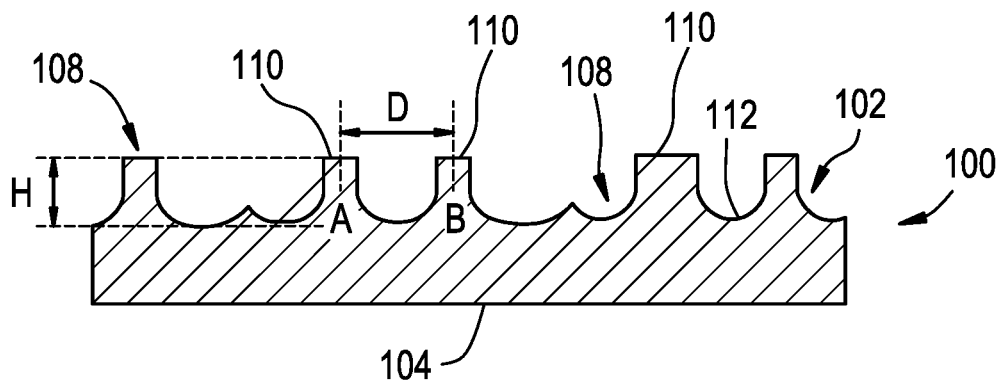
FIG. 2 is an enlarged view of FIG. 1D.

In some embodiments, the tactile feel is influenced by the characteristics of features 108 created as a result of treating first surface 102 with the first and second chemical etching solutions in the manner described above. FIG. 2 is an enlarged view of FIG. 1D and illustrates some of the characteristics or properties of features 108 that can be measure and that can contribute to the touch feel of first surface 102. Properties include the height H of a protrusion and a distance D between adjacent similar features (e.g., between adjacent protrusions or between adjacent dimples). The height H can be determined by measuring the distance between the peak of a protrusion and a bottom of an adjacent dimple. H can also refer to the depth of a dimple or recess. In some embodiments, the height can be a measurement of the surface roughness (Ra). In some embodiments, an average height of the protrusions (or depth of the recesses) on first surface 102 can be in a range from about 80 nm or higher or about 100 nm or higher. The surface roughness (Ra) was determined with a Newview™ 7300 (Zygo Corporation, Middlefield, CT). The distance D can be determined by measuring the distance between the center of a feature, for example the center of a protrusion as shown in FIG. 2 and the center of an adjacent feature of the same type, for example the center of an adjacent protrusion as shown in FIG. 2. Alternatively, the distance D can be the distance between the centers of adjacent dimples. In some embodiments, the distance between adjacent similar features can be in a range from about 0.5 μm to about 25 μm, from about 0.5 μm to about 23 μm, from about 0.5 μm to about 20 μm, from about 0.5 μm to about 17 μm, from about 0.5 μm to about 15 μm, from about 0.5 μm to about 10 μm, from about 0.5 μm to about 5 μm, from about 2 μm to about 25 μm, from about 2 μm to about 23 μm, from about 2 μm to about 20 μm, from about 2 μm to about 17 μm, from about 2 μm to about 15 μm, from about 2 μm to about 10 μm, from 5 μm to about 25 μm, from about 5 μm to about 23 μm, from about 5 μm to about 20 μm, from about 5 μm to about 17 μm, from about 5 μm to about 15 μm, from about 7 μm to about 25 μm, from about 7 μm to about 23 μm, from about 7 μm to about 20 μm, from about 7 μm to about 17 μm, from about 7 μm to about 15 μm, from about 10 μm to about 25 μm, from about 10 μm to about 23 μm, from about 10 μm to about 20 μm, from about 10 μm to about 17 μm, or from about 10 μm to about 15 μm. The feature distance D is a factor in the density of the features, which is another characteristic tactile feel. In some embodiments, the density of similar features (e.g., protrusions or dimples) can be in a range from about 9,000 features/mm$^2$ to about 25,000 features/mm$^2$, about 9,000 features/mm$^2$ to about 23,000 features/mm$^2$, about 9,000 features/mm$^2$ to about 20,000 features/mm$^2$, about 9,000 features/mm$^2$ to about 17,000 features/mm$^2$, about 9,000 features/mm$^2$ to about 15,000 features/mm$^2$, about 10,000 features/mm$^2$ to about 25,000 features/mm$^2$, about 10,000 features/mm$^2$ to about 23,000 features/mm$^2$, about 10,000 features/mm$^2$ to about 25,000 features/mm$^2$, about 10,000 features/mm$^2$ to about 20,000 features/mm$^2$, about 10,000 features/mm² to about 17,000 features/mm², about 11,000 features/mm² to about 25,000 features/mm², about 11,000 features/mm² to about 23,000 features/mm², about 11,000 features/mm² to about 25,000 features/mm², about 11,000 features/mm² to about 20,000 features/mm², about 11,000 features/mm² to about 17,000 features/mm², about 12,000 features/mm² to about 25,000 features/mm², about 12,000 features/mm² to about 23,000 features/mm², about 12,000 features/mm² to about 25,000 features/mm², about 12,000 features/mm² to about 20,000 features/mm², or about 12,000 features/mm² to about 17,000 features/mm². The distance D and feature density can be measured by using an optical microscope to zoom in on the surface to a factor of about 200, taking a picture of the image, and then measuring the distance D between similar features and count the number of a specific type of feature within a specific area.

In some embodiments, the glass-ceramic article can be subjected to a chemical strengthening process, such as an ion exchange process. In some embodiments, the glass-ceramic article can be chemically strengthened before performing the etching steps. In other embodiments, the glass-ceramic article can be chemically strengthened after performing the etching steps.

In some embodiments, the surface modifications described herein can be applied to more than one surface of the glass-ceramic article. For example, the surface modification processes described herein can be applied to both first surface 102 and second surface 104 of glass-ceramic article 100 to increase the tactile feel.

EXAMPLES

Various embodiments will be further clarified by the following example.

As discussed above, the properties of the surface features (e.g., feature height, feature distance, and feature density) can affect the tactile feel of the surface. The composition of the first chemical etching solution, can in turn affect the properties of the surface features as shown in the following example.

Eight samples of black glass-ceramic surfaces were each etched in a different etching solution as shown below in Table 1. The black glass-ceramic samples had a nominal composition, in weight percent, of about 57% $SiO_2$, about 21% $Al_2O_3$, about 5% $B_2O_3$, about 13% $Na_2O$, about 1% MgO, about 1% $TiO_2$, and about 1% $Fe_2O_3$. Each of the etching solutions contained hydrofluoric acid (HF), polyethylene glycol (PG), and ammonium fluoride ($NH_4F$), and the composition was varied to have 3 or 6% (w/w) hydrofluoric acid, 10 or 25% (w/w) polyethylene glycol, and 2.5 or 5% (w/w) ammonium fluoride. The etching solution was applied by soaking each sample vertically in a static etch bath. The samples were etched for approximately 8 minutes at 22° C. The samples were then polished in an etching solution of 1.5M hydrofluoric acid and 0.9 M sulfuric acid for approximately 10 minutes. Table 1 lists the first etching solution composition, the average feature distance, average protrusion height, surface roughness, gloss, feature density, and tactile feel. The surface roughness (Ra), average feature distance, feature density, and touch feel were determined according to the methods described above. The gloss values at 60° were determined in accordance with ASTM procedure D523.

TABLE 1

| Solution | PG (10-25%) | HF (3-6%) | $NH_4F$ (2.5-5%) | Ra (μm) | Gloss 60° (A, B sides) | | Average Feature distance (μm) | Feature Density (features/mm²) | Tactile Feel (1-7)* |
|---|---|---|---|---|---|---|---|---|---|
| 1 | 25 | 6 | 5 | 0.474 | 2.8 | 2.8 | 8.5 | 13841 | 5-6 |
| 2 | 10 | 6 | 5 | 1.021 | 8.7 | 8.7 | 18 | 3086 | 2 |
| 3 | 25 | 3 | 5 | 0.256 | 6.1 | 6.2 | 7.2 | 19290 | 6 |
| 4 | 10 | 3 | 5 | 0.189 | 36.5 | 35.4 | 12 | 6944 | 4 |
| 5 | 25 | 6 | 2.5 | 0.082 | 75.7 | 72.7 | 10.3 | 9426 | 5 |
| 6 | 10 | 6 | 2.5 | 0.066 | 72.5 | 79.5 | 28 | 1276 | 5 |
| 7 | 25 | 3 | 2.5 | 0.337 | 12.1 | 12.2 | 9.2 | 11815 | 4 |
| 8 | 10 | 3 | 2.5 | 0.255 | 46.8 | 46.4 | 14 | 5102 | 3-4 |

Figure 3:
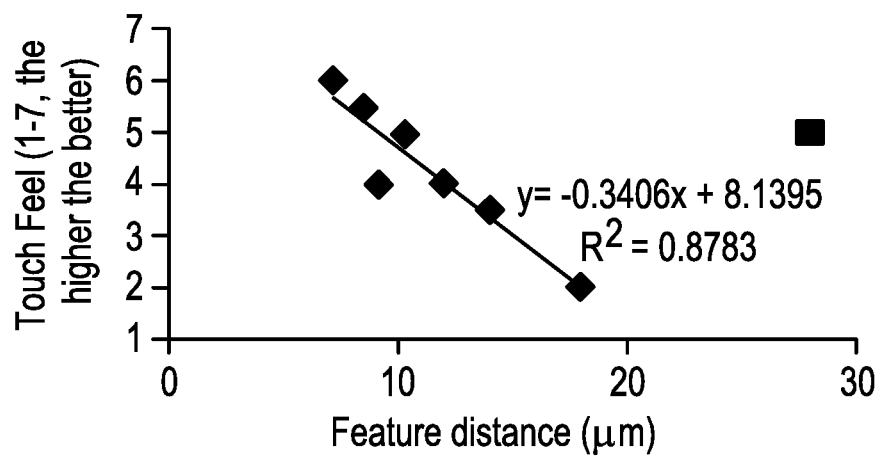
FIG. 3 is a plot of an average feature distance vs. the tactile feel.

As can be seen, increasing the amount of hydrofluoric acid increases the feature distance and increasing the amount of polyethylene glycol or ammonium fluoride decreases the feature distance. The data from Table 1 indicates that increasing the average feature distance results in a linear decrease in the tactile feel rating. FIG. 3 is a plot of the average feature distance (x-axis) vs. the tactile feel rating (y-axis) and indicates a linear relationship of tactile feel rating=(−0.3406*the average feature distance)+8.1395, with an $R^2$ value of 0.8783. It is noted that solution 6 is an outlier that does not follow this relationship. A possible explanation is could be the subjectiveness of the tactile feel test.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A glass-ceramic article comprising:
   a glass-ceramic surface having a plurality of features, wherein:
      the plurality of features comprises protrusions in the glass-ceramic surface,
      the glass-ceramic surface has a surface roughness Ra in a range from greater than or equal to 0.474 μm up to 1 μm,
      a density of the plurality of features is in a range from 9,000 to 25,000 features/mm², and
      the glass-ceramic article is opaque.

2. The glass-ceramic article of claim 1, wherein an average distance between adjacent features of a same type is in a range from 7 μm to 10 μm.

3. An electronic device comprising the glass-ceramic article of claim 1, wherein the glass-ceramic surface is positioned such that a user can touch the glass-ceramic surface.

4. An electronic device comprising the glass-ceramic article of claim 1, wherein the glass-ceramic surface is positioned such that a user can touch the glass-ceramic surface.

5. The glass-ceramic article of claim 1, wherein an average distance between adjacent features of a same type is in a range from 8.5 µm to 10 µm.

6. The glass-ceramic article of claim 1, wherein the density of features of the same type is in a range from 12,000 to 25,000 features/mm$^2$.

7. The glass-ceramic article of claim 1, wherein the density of features of the same type is in a range from 12,000 to 17,000 features/mm$^2$.

8. The glass-ceramic article of claim 1, wherein the glass-ceramic article is black.

9. The glass-ceramic article of claim 1, wherein the glass-ceramic article is white.

10. The glass-ceramic article of claim 1, wherein the glass-ceramic article is a lithium aluminosilicate glass-ceramic article.

11. The glass-ceramic article of claim 1, wherein the glass-ceramic article is a magnesium aluminosilicate glass-ceramic article.

12. The glass-ceramic article of claim 1, wherein the glass-ceramic article is a zinc oxide aluminosilicate glass-ceramic article.

13. The glass-ceramic article of claim 1, wherein the glass-ceramic article comprises a spodumene phase.

14. The glass-ceramic article of claim 1, wherein the glass-ceramic article comprises greater than or equal to 30% by volume crystallinity.

15. The glass-ceramic article of claim 1, wherein the glass-ceramic article comprises greater than or equal to 90% by volume crystallinity.

16. The glass-ceramic article of claim 1, wherein the glass-ceramic article comprises less than 30% by volume crystallinity.

17. The glass-ceramic article of claim 1, wherein an average depth of the recesses is about 80 nm or more.

18. The glass-ceramic article of claim 1, wherein an average depth of the recesses is about 100 nm or more.

* * * * *